United States Patent
Otremba et al.

(10) Patent No.: US 9,196,577 B2
(45) Date of Patent: Nov. 24, 2015

(54) SEMICONDUCTOR PACKAGING ARRANGEMENT

(71) Applicant: Infineon Technologies AG, Neubiberg (DE)

(72) Inventors: Ralf Otremba, Kaufbeuren (DE); Josef Höglauer, Heimstetten (DE); Jürgen Schredl, Mering (DE); Xaver Schlögel, Sachsenkam (DE); Klaus Schiess, Allensbach (DE)

(73) Assignee: Infineon Technologies AG, Neubiberg (DE)

( * ) Notice: Subject to any disclaimer, the term of this patent is extended or adjusted under 35 U.S.C. 154(b) by 130 days.

(21) Appl. No.: 14/151,110

(22) Filed: Jan. 9, 2014

(65) Prior Publication Data
US 2015/0194373 A1     Jul. 9, 2015

(51) Int. Cl.
*H01L 23/48* (2006.01)
*H01L 23/52* (2006.01)
*H01L 23/495* (2006.01)

(52) U.S. Cl.
CPC ...... *H01L 23/49575* (2013.01); *H01L 23/4952* (2013.01); *H01L 23/49513* (2013.01); *H01L 23/49541* (2013.01)

(58) Field of Classification Search
CPC .............. H01L 29/41766; H01L 24/32; H01L 2224/4903
USPC ................................... 257/735, 780, 781, 778
See application file for complete search history.

(56) References Cited

U.S. PATENT DOCUMENTS

| | | | |
|---|---|---|---|
| 6,274,823 B1 | 8/2001 | Khandros et al. | |
| 6,404,041 B1 | 6/2002 | Gantioler et al. | |
| 7,256,501 B2 * | 8/2007 | Okamoto et al. | 257/772 |
| 7,786,558 B2 | 8/2010 | Otremba | |
| 8,044,523 B2 | 10/2011 | Otremba | |
| 8,183,607 B2 * | 5/2012 | Kajiwara et al. | 257/288 |
| 8,354,692 B2 | 1/2013 | Otremba | |
| 2004/0061221 A1 * | 4/2004 | Schaffer | 257/723 |
| 2007/0215980 A1 | 9/2007 | Otremba | |
| 2007/0290337 A1 | 12/2007 | Otremba | |
| 2014/0008702 A1 | 1/2014 | Otremba | |

FOREIGN PATENT DOCUMENTS

| | | |
|---|---|---|
| DE | 19806817 C1 | 7/1999 |
| DE | 102004021054 A1 | 11/2005 |
| DE | 102007012986 A1 | 10/2007 |
| DE | 102004030042 B4 | 4/2009 |

* cited by examiner

*Primary Examiner* — S. V. Clark
(74) *Attorney, Agent, or Firm* — Murphy, Bilak & Homiller, PLLC

(57) ABSTRACT

A semiconductor packaging arrangement includes a transistor device including a first side including a source electrode and a gate electrode, a die pad having a first surface, and a lead having a first surface. A first conductive member is arranged between the source electrode and the first surface of the die pad and spaces the source electrode from the first surface of the die pad by a distance that is greater than a distance between the gate electrode and the first surface of the lead.

20 Claims, 4 Drawing Sheets

SEMICONDUCTOR PACKAGING ARRANGEMENT

BACKGROUND

An electronic component may include one or more semiconductor devices in a package with outer contacts. The outer contacts are used to mount the electronic component on a redistribution board, such as a printed circuit board. The package may include a housing which covers the semiconductor device and the internal electrical connections from the semiconductor device. The outer contacts of the package may have different forms, for example, pins, lands or solder balls.

SUMMARY

In an embodiment, a semiconductor packaging arrangement includes a transistor device having a first side including a source electrode and a gate electrode, a die pad having a first surface, and a lead having a first surface. A first conductive member is arranged between the source electrode and the first surface of the die pad and spaces the source electrode from the first surface of the die pad by a distance that is greater than a distance between the gate electrode and the first surface of the lead.

In an embodiment, a semiconductor package includes a die pad having a first surface, at least two leads, and a transistor device having a first side including a source electrode and a gate electrode and a second side opposing the first side, the second side including a drain electrode. A first conductive member is arranged between and spaces the source electrode from the first surface of the die pad by a distance that is greater than a distance between the gate electrode and the first surface of the lead.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
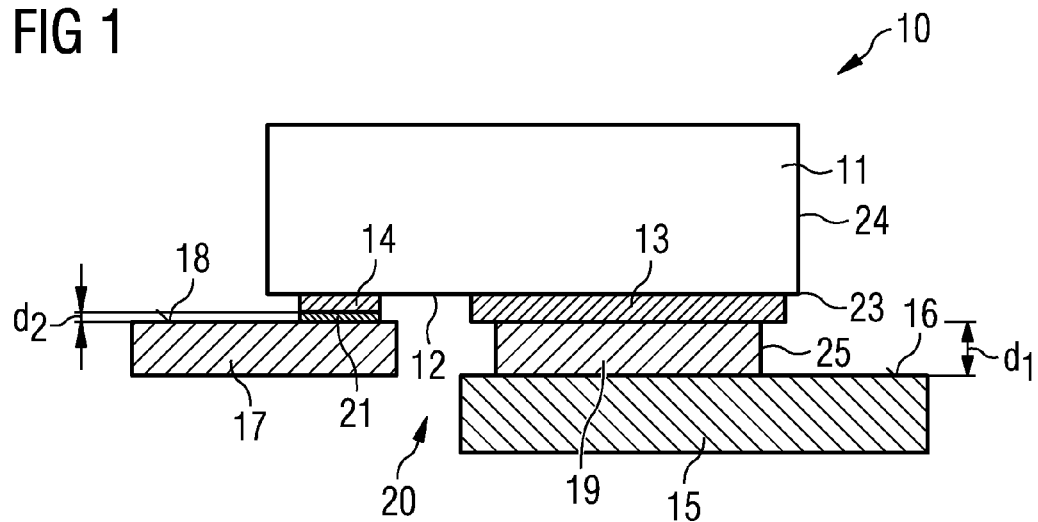
FIG. 1 illustrates a semiconductor packaging arrangement according to a first embodiment.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier As employed in this specification, the terms "coupled" and/or "electrically coupled" are not meant to mean that the elements must be directly coupled together—intervening elements may be provided between the "coupled" or "electrically coupled" elements.

As used herein, a "high-voltage device," such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device," such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

FIG. 1 illustrates an arrangement 10 according to a first embodiment which includes a semiconductor device, in particular a transistor device 11 that has a first side 12 including a source electrode 13 and a gate electrode 14. The arrangement further includes a die pad 15 having a first surface 16, a lead 17 having a first surface 18 and a first conductive member 19. The first conductive member 19 is arranged between the source electrode 13 and the first surface 16 of the die pad 15 and spaces the source electrode 13 from the first surface 16 of the die pad 15 by a distance $d_1$ which is greater than a distance $d_2$ between the gate electrode 14 and the first surface 18 of the lead 17.

The transistor device 11 may be a MOSFET or an Insulated Gate Bipolar Transistor (IGBT) and may be a high-voltage device. The transistor device 11 may be a vertical device. The transistor device 11 is mounted in a so-called source-down arrangement in which the source electrode 13 faces towards the die pad 15. The first surface 16 of the die pad 15 and the first surface 18 of the lead 17 face towards the first side 12 of the transistor device 11. The lead 17 is arranged adjacent a side face of the die pad 15 and the transistor device 11 extends between the die pad 15 and the lead 17 such that it covers a gap 20 between the lead 17 and the die pad 15. The gate electrode 14 may be mounted on, and electrically coupled to, the first surface 18 of the lead 17, for example by a solder connection 21.

The source-down arrangement may assist in reducing the parasitic inductance of the source connection which, in turn, may assist in improving the switching efficiency. The arrangement illustrated in FIG. 1 may be used to mount a transistor device 11 having the source-down arrangement in standard packages such as a SuperSO8, a TO220 or a TO247 package outline. In package outlines which include a difference in height between the upper surface 18 of the lead 17 and the upper surface 16 of the die pad 15, the difference in height may be compensated by the height of the first conductive member 19. Consequently, the first side 12 of the transistor device 11 may be substantially planar despite the height difference between the first surface 18 of the lead 17 and the first surface 16 of the die pad 15.

The distance $d_1$ between the transistor device 11 and the die pad 15 may be selected to assist in achieving a desired avalanche voltage. For example, the distance may be selected as 1 nm per 10 V and the avalanche voltage may lie in the range from 10 V to 10 kV. Additionally, the first conductive member 19 may have a form and arrangement such that edges 23 of the transistor device 11 formed between the first side 12 and side faces 24 of the transistor device 11 are spaced apart from an outer surface 25 of the first conductive member 19 and from the upper surface 16 of the die pad 15.

The gate electrode 14 may be mounted on, and electrically coupled to, the first surface 18 of the lead 17, for example by a solder connection. The source electrode 13 may be electrically coupled to the die pad 15 by the first conductive member 19. The first surface 18 of the lead 17 may be arranged in a different plane from the first surface 16 of the die pad 15. The lead 17 may be formed such that a proximal portion of the first surface 18 of the lead 17, which is positioned adjacent the die pad 15, is arranged in a different plane from the first surface 16 of the die pad 15. The remaining distal portion of the lead 17 may lie in a different plane, for example, the remaining distal portion may be substantially coplanar with the die pad 15.

The arrangement 10 may further include a second conductive member 21 arranged between the gate electrode 14 and the first surface 18 of the lead 17. The second conductive member 21 may have a smaller height than the height of the first conductive member 19. The arrangement 10 may further include a plurality of first conductive members 19 arranged between the source electrode 13 and the first surface 16 of the die pad 15. The plurality of first conductive members may be spaced from one another and positioned in a regular arrangement over the lateral area of the source electrode 13.

The first conductive member 19 and, if present, the second conductive member 21, may include a first portion having a first melting point and a second portion having a second melting point that is lower than the first melting point. The first portion may be substantially covered by the second portion such that the first conductive member includes a core having a higher melting point than a mantle surrounding the core. In some embodiments, only the side faces of the first portion may be substantially covered by the second portion and the first portion is in direct contact with the source electrode and the die pad or with the gate electrode and the lead.

The first portion may include a ball bump, wedge bump or a bond wire loop. The ball bump, wedge bump or bond wire loop may include a metal or alloy, for example aluminium or gold, or an aluminium alloy or a gold alloy. The second portion may include solder, for example, a soft solder, or electrically conductive adhesive. The solder or electrically conductive adhesive may conform to the outer contour of the first portion such that the solder or electrically conductive adhesive is spaced from the edges 23 formed between the first side 12 and the side faces 24 of the transistor device 11. The edges 23 of the transistor device 11 formed between the first side 12 and side faces 24 of the transistor device 11 may be spaced at a distance from the second portion of the first conductive member 19. The arrangement 10 and in particular the first conductive member 19 may further include intermetallic phases arranged between the first portion and the second portion. The first portion may include a metal or an alloy, the second portion may include a solder and the intermetallic phases may include at least one element present in the first portion and at least one element present in the second portion.

The arrangement may be used in a semiconductor package which includes a die pad having a first surface, at least two leads and at least one transistor device. The transistor device includes a first side having a source electrode and a gate electrode and a second side which opposes the first side and which includes a drain electrode. A first conductive member is arranged between the source electrode and the first surface of the die pad and spaces the source electrode from the first surface of the die pad by a distance that is greater than the distance between the gate electrode and the first surface of the lead. The gate electrode may be arranged on the lead. The semiconductor package may include a second conductive member which is arranged between the gate electrode and the first surface of the lead. The second conductive member may space the gate electrode a distance from the first surface of the lead that is less than a distance between the source electrode and the die pad. A gap between an end of the lead proximal to the die pad and the die pad within the semiconductor package is less than a distance between portions of the lead and the die pad at an outer surface of the semiconductor package. The lead may be formed such that the end of the lead proximal the die pad is arranged within the semiconductor package and an end of the lead distal to the die pad is at least partially exposed from the semiconductor package. The drain electrode may be electrically coupled to at least one of the leads, for example by one or more bond wires or a contact clip. At least one edge of the transistor device formed between the first side and at least one side face of the transistor device may be spaced at a distance from the first conductive member.

The semiconductor package may further include a second die pad and a second transistor device including a first side having a source electrode and the gate electrode and second side opposing the first side that includes a drain electrode. The drain electrode of the second transistor device may be arranged on the second die pad and be electrically coupled to the second die pad. The first transistor device and the second transistor device may be configured in a half bridge arrangement.

Figure 2:
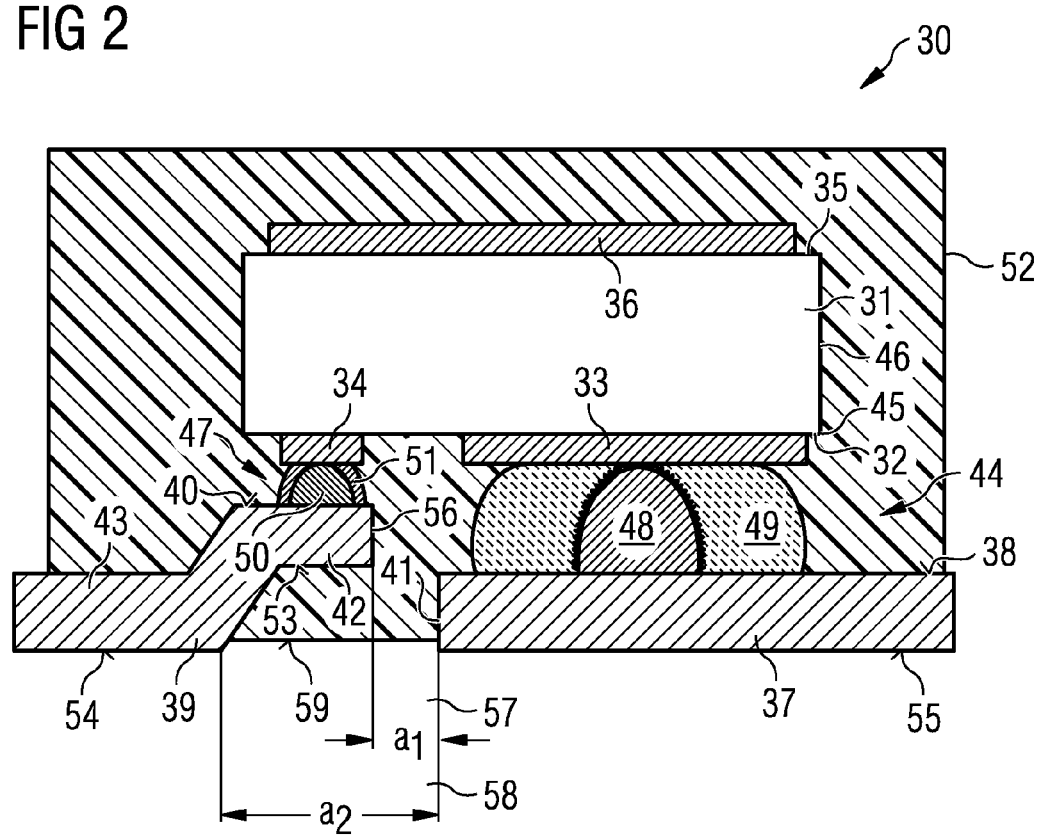
FIG. 2 illustrates a semiconductor packaging arrangement according to a second embodiment.

FIG. 2 illustrates an arrangement 30 including a transistor device 31 having a first side 32 on which a source electrode 33 and a gate electrode 34 are arranged. The transistor device 31 includes an opposing second side 35 which includes a drain electrode 36. The arrangement further includes a die pad 37 having an upper surface 38 and a lead 39 including an upper surface 40. The transistor device 31 is arranged such that the first side 32 faces towards the upper surface 38 of the die pad 37 and the upper surface 40 of the lead 39. The lead 39 is spaced at a distance from a side face 41 of the die pad 37 and has a form such that the upper surface 40 of the lead 39 in a proximal portion adjacent the side face 41 is arranged in a different plane from the upper surface 38 of the die pad 37. In particular, the proximal end 42 of the lead 39 is positioned above the upper surface 38 of the die pad 37. The lead 39 may be bent or otherwise formed so that a distal end 43 of the lead 39 is substantially coplanar with the die pad 37.

The source electrode 33 is mounted on and electrically coupled to the die pad 37 by a first conductive member 44 extending between the source electrode 33 and the upper surface 38 of the die pad 37. The first conductive member 44 has a height which spaces the source electrode 33 away from the upper surface 38 of the die pad 37 and a lateral extent which is less than the lateral extent of the source electrode 33. Edges 45 formed between the first side 32 and side faces 46 of the transistor device 31 are spaced at a distance from the die pad 37 and the lead 39 and remain uncovered by the material of the first conductive member 44 which provides the electrical coupling between source electrode 33 and the die pad 37.

The arrangement 30 includes a second conductive member 47 arranged between the upper surface 40 of the proximal end 42 of the lead 39 and the gate electrode 34. The second conductive member 47 has a height which is less than the height of the first conductive member 44 such that the first side 32 of the transistor device 31 is substantially planar.

The first conductive member 44 includes a first portion 48 which is surrounded by a second portion 49. The first portion 48 has a melting point which is higher than a melting point of the second portion 49. For example, the first portion 48 may include a metal or an alloy, such as aluminium or copper or an aluminium alloy, and the second portion 49 may include a soft solder, such as a solder including tin, for example, a lead tin silver solder, or an electrically conductive adhesive. In this embodiment, the first portion 48 is formed by a ball bump. Ball bumps can be fabricated using bond wire forming apparatus, for example to attach a ball bump to the upper surface 38 of the die pad 37. The ball bump 48 may then be covered by solder or solder paste or electrically conductive adhesive. The second portion 49 may be melted and resolidified to mechanically and electrically connect the source electrode 33 to the die pad 37.

The first portion 48 may be in direct contact with the source electrode 33 or a small region of the region of the second portion 49 may be arranged between the first portion 48 and the source electrode 33.

The first portion 48 may be used to provide the physical spacing property of the first conductive member 44, since it remains solid when the second portion 49 is melted to adhere and electrically couple the source electrode 33 to the die pad 37. However, the first portion 48 also provides a portion of the conductive connection provided by the first conductive member 44 since it is also electrically conductive.

The second conductive member 47 also includes a first portion 50 having a first melting point and a second portion 51 having a second melting point which is lower than the first melting point. The first portion 50 may also be a ball bump including a metal or an alloy and the second portion 51 may include a soft solder or an electrically conductive adhesive. The ball bump 50 has a smaller height and lateral size than the ball bump 48.

The first portion 48 of the first conductive member may include at least one element which reacts with at least one element of the second portion 49 to form one or more intermetallic compounds when the second portion 49 is melted. The formation of intermetallic compounds may assist in providing a good mechanical joint between the source electrode 33 and the die pad 37. The intermetallic compounds are indicated schematically in FIG. 2 by the hashed region at the interface between the first portion 48 and the second portion 49. The first portion 50 of the second conductive member 47 may also include at least one element which forms at least one intermetallic phase with at least one element of the second portion 51 to assist producing a good mechanical joint between the gate electrode 34 and the lead 39 as well as between the first portion 50 and the second portion 51.

In an embodiment, the first portion 48 includes copper and the second portion 49 includes a tin containing solder such as a lead tin silver solder. Similarly, the first portion 50 of the second conductive member 47 may include copper and the second portion 51 may include a tin containing solder such as a lead tin silver solder.

The arrangement 30 also includes a housing 52 including a mould compound such as epoxy resin. The housing 52 covers the transistor device 31 and the upper surface of 38 of the die pad 37 and the upper surface 40 of the lead 39. The proximal end 42 of the lead 39 is positioned within the housing 52 such that a lower surface 53 of the proximal end 42 is embedded entirely within the housing 52. A lower surface 54 of the distal end 43 of the lead 39 is exposed from the housing 52 and provides an outer contact. A lower surface 55 of the die pad 37 is also exposed from the housing 52 and provides an outer contact.

A gap 57 between the side face 41 and a side face 56 of the lead 39 within the housing is denoted in FIG. 2 by $a_1$. A gap 58 between the exposed lower surface 54 of the distal end 43 of the lead 39 and the lower surface 55 of the die pad 37 is greater and is denoted in FIG. 2 as $a_2$. The bent arrangement of the lead 39 enables the distance between the side face 56 of the lead 39 and the side face 41 of the die pad 37 to be small within the housing 52 which may be useful when mounting the transistor device 31 since the transistor device 31 bridges the gap 57. The gap 58 between the adjacent conductive regions provided by the lower surface 54 of the distal end 43 and the lower surface 55 of the die pad 37 at an outermost surface 59 of the housing 52 is larger thus enabling an increased creepage distance, despite the smaller gap 57 between the lead 39 of the die pad 37 within the housing 52.

Figure 3:
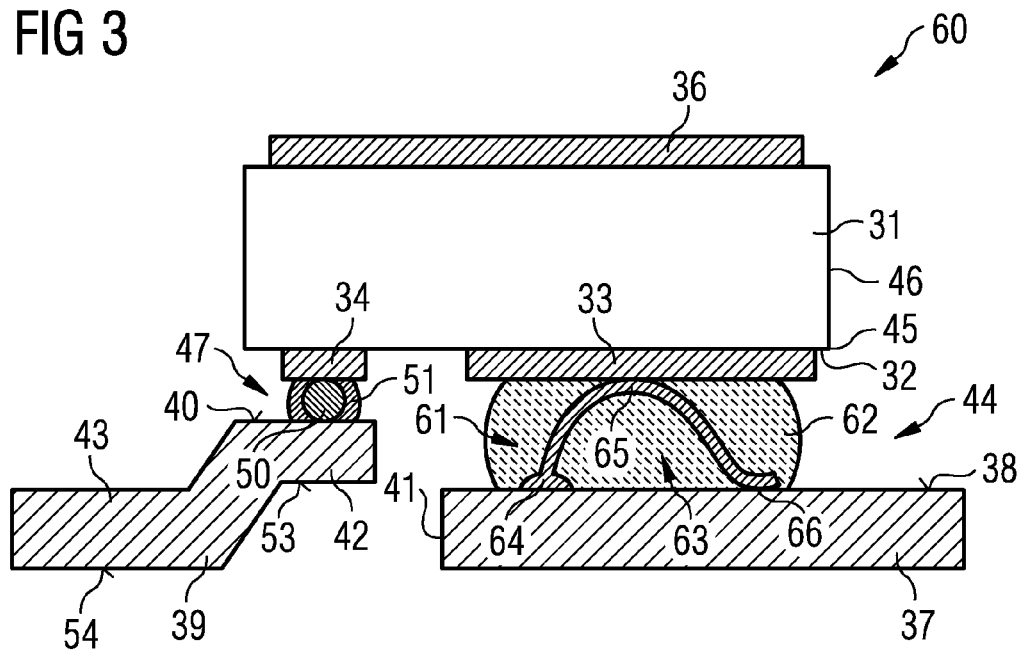
FIG. 3 illustrates a semiconductor packaging arrangement according to a third embodiment.

FIG. 3 illustrates an arrangement 60 according to a third embodiment. The arrangement 60 includes a transistor device 31, a die pad 37 and a lead 39 having the configuration illustrated in FIG. 2. The arrangement 60 according to the third embodiment differs from that illustrated in FIG. 2 by the structure of the first conductive member 44 arranged between the source electrode 33 and the upper surface 38 of the die pad 37.

The first conductive member 44 includes a first portion 61 and a second portion 62 which substantially covers the first portion 61. The first portion 61 is provided by a bond wire loop 63. The bond wire loop 63 has a first end 64 attached to the upper surface 38 by a thermocompression bond head and extends in an arc 65 to a second end 66 spaced at a distance from the first end 64. The second end 66 is attached to the upper surface 38 of the die pad 37 by, for example, a wedge bond. The arc 65 may be used to provide a spacing element having a height suitable for spacing the source electrode 33 from the upper surface 38 of the die pad 37 by a desired distance. The first portion 61 is covered by a second portion 62 which has a lower melting point than the material of the bond wire loop 63. The bond wire loop may, for example, include aluminium or an aluminium alloy or copper. The second portion 62 may include a soft solder.

The arrangement 60 also includes a second conductive member 47 arranged between the gate electrode 34 and the upper surface 40 of the proximal end 42 of the lead 39. The second conductive member 47 includes a first portion 50 surrounded by a second portion 51. The first portion may include a bond wire loop or may include a different first portion, such as a ball bump.

Figure 4:
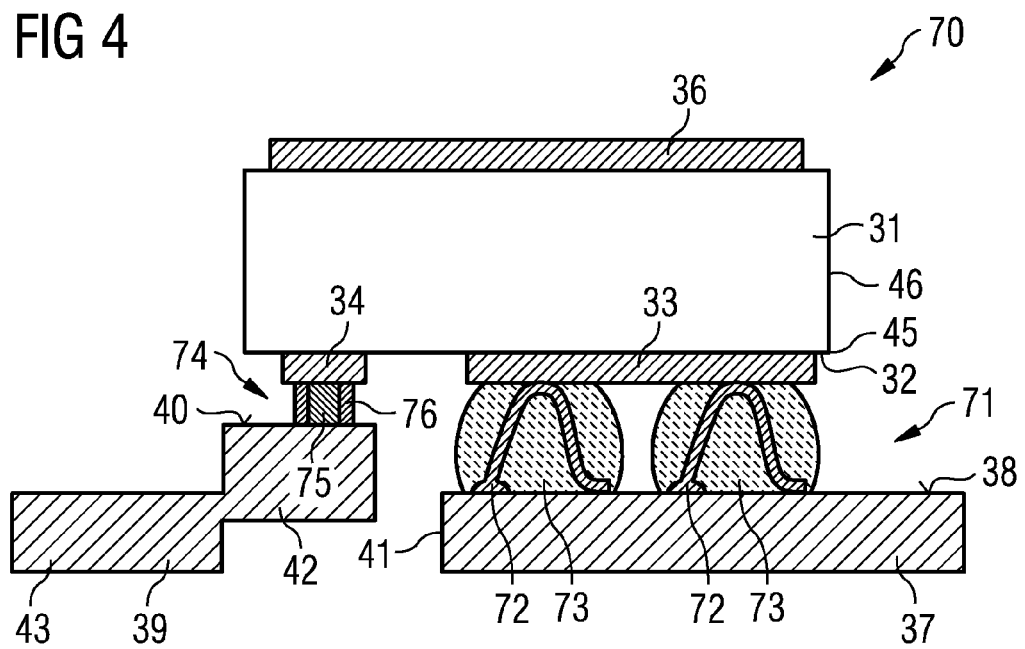
FIG. 4 illustrates a semiconductor packaging arrangement according to a fourth embodiment.

FIG. 4 illustrates an arrangement 70 according to a fourth embodiment. The arrangement 70 includes a transistor 31, a die pad 37 and a lead 39 having the configurations illustrated in FIGS. 2 and 3. The arrangement 70 according to the fourth embodiment includes a plurality of conductive members 71 arranged between the source electrode 33 and the upper surface 38 of the die pad 37, of which two of the plurality of conductive members 71 can be seen in the cross-sectional view of FIG. 4.

In the fourth embodiment, each first conductive member 71 includes a first portion 72 in the form of a bond wire loop and a second portion 73 covering the first portion 72. The individual ones of the plurality of first conductive members 71 are laterally spaced apart from one another and each extends between the source electrode 33 and the die pad 37.

The plurality of first conductive members 71 may have a different structure, for example, each first conductive member may include a ball bump covered by solder or a wedge bump covered by solder. The plurality of first conductive members 71 may be distributed uniformly across the lateral area of the source electrode 33 to provide a uniform mechanical connection. Each of the plurality of first conductive members may have the same structure or the structure of one or more of the first conductive members may differ.

The arrangement 70 also includes a second conductive member 74 which is arranged between the gate electrode 34 and the upper surface 40 of the proximal end 42 of the lead 39. The second conductive member 74 includes a first portion 75 in the form of a wedge bond which is substantially covered by a second portion 76 having a lower melting point than the melting point of the wedge bond 75. The wedge bond 75 may include aluminium or copper and may be produced by fabricating a wedge bond using a wedge bonding tool on the upper surface 40 of the lead 39. The wedge bond may then be covered by the electrically conductive material having a lower melting point, for example an electrically conductive adhesive or soft solder.

The lead 39 may be formed by shearing a planar lead 39 to produce the proximal end 42 positioned above the distal end 43. The lead may also be formed by bending a planar lead as is illustrated in the embodiments illustrated in FIGS. 2 and 3.

The arrangement illustrated in FIGS. 3 to 4 may be used in a package having a standard outline such as SuperSO8 package or in TO-type packages such as a T0220 or a TO247 package. The package outline may be a so called through hole package in which the leads are mounted in holes of a circuit board or have a surface mount device configuration in which the leads are mounted on the surface of the circuit board.

Figure 5:
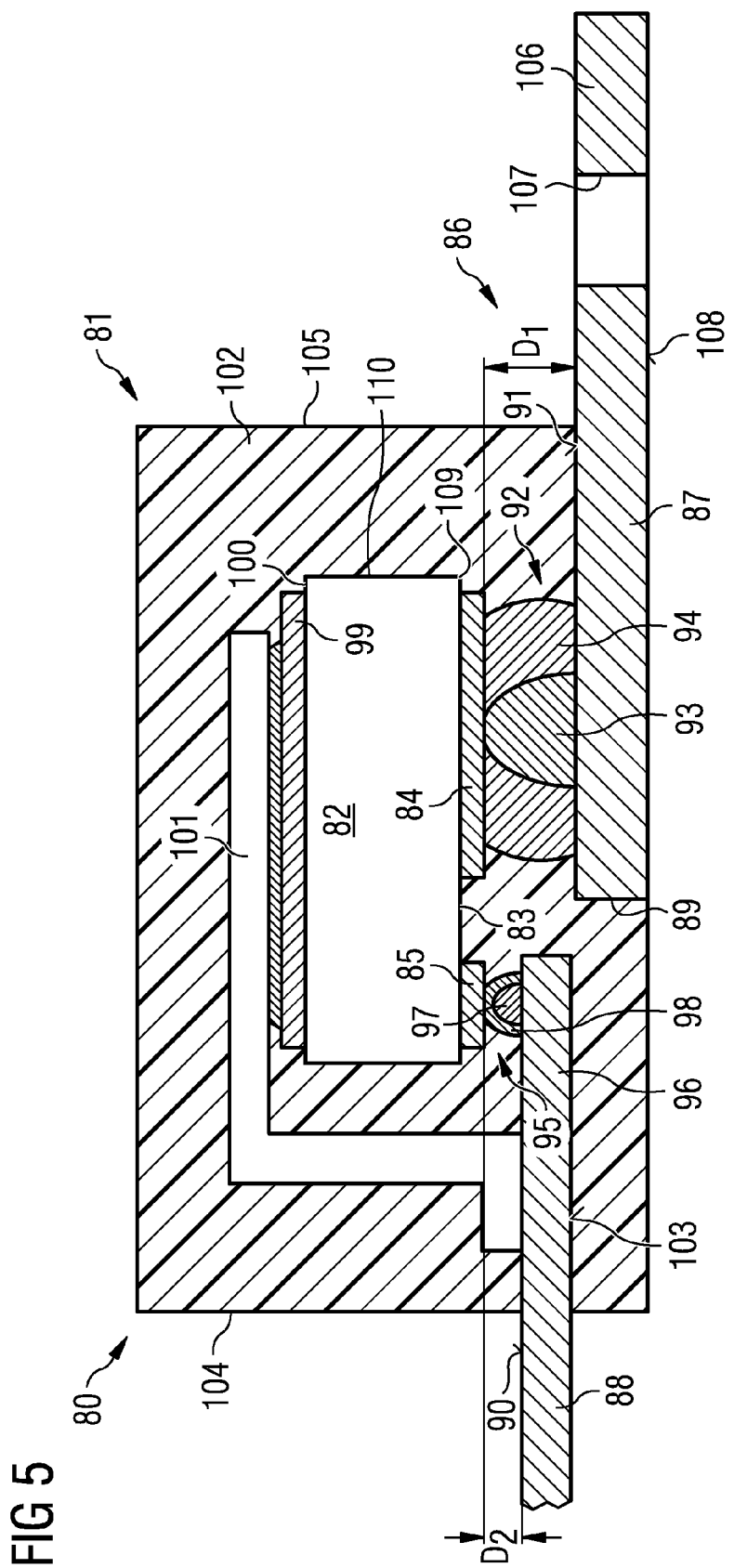
FIG. 5 illustrates a cross-sectional view of a semiconductor package according to a fifth embodiment.

FIG. 5 illustrates a semiconductor package 80 which is a through hole package having a standard package outline, for example a TO220 package outline. The semiconductor package 80 also includes an arrangement 81 including a semiconductor device in the form of a transistor device 82 having a first side 83 including a source electrode 84 and a gate electrode 85 and a lead frame 86.

The lead frame 86 includes a die pad 87 and three leads of which only one lead 88 is seen in the cross-sectional view of FIG. 5. The three leads are positioned adjacent a common side face 89 of the die pad 87. Two of the leads are spaced at a distance from the side face 89 of the die pad 87 and a third lead, not seen in the cross-section view of FIG. 5, extends from the die pad 87. The plurality of leads have a first surface 90 which is positioned in a plane that is higher than an upper surface 91 of the die pad 87.

The transistor device 82 is arranged such that it extends between the lead 88 and the die pad 87. The source electrode 84 faces towards and is positioned above the upper surface 91 of the die pad and the gate electrode 85 faces towards and is positioned above the first surface 90 of the lead 88.

The arrangement 81 further includes a first conductive member 92 arranged between the source electrode 84 and the upper surface 91 of the die pad 87 which spaces the source electrode 84 from the upper surface 91 of the die pad 87. The first conductive member 92 mechanically and electrically couples the source electrode 84 to the die pad 87. The first conductive member 92 includes a first spacer portion 93 having a melting point $T_1$ and a second portion 94 having a melting point $T_2$, whereby $T_2$ is less than $T_1$. This enables the second portion 94 to be melted whilst the first portion 93 remains solid and maintains the space between the first side 83 of the transistor device 82 and the die pad 87.

The first spacer portion 93 is provided by a ball bump which extends between the source electrode 84 and the upper surface 91 of the die pad 87 and spaces the source electrode 84 on the upper surface 91 of the die pad 87 by a distance $D_1$. The second portion 94 surrounds at least the side faces of the first spacer portion 93 and includes an electrically conductive material such as soft solder or electrically conductive adhesive. The second portion 94 provides an adhesive connection between the source electrode 84 and the die pad 87.

The arrangement 81 further includes a second conductive member 95 which is arranged between the gate electrode 85 and the first surface 90 of the lead 88. The second conductive member 95 is arranged at a proximal end 96 of the lead 88 adjacent to the side face 89 of the die pad 87. The second conductive member 95 includes a first spacer portion 97 extending between the gate electrode 85 and the first surface 90 of the lead 88 and a second portion 98 which covers at least the side faces of the first spacer portion 97. The first spacer portion 97 includes a material having a melting point $T_3$ and the second portion 98 includes a material having a melting point $T_4$, where $T_4$ is less than $T_3$. The materials of the first spacer portion 97 and of the second portion 98 of the second conductive member 95 may be the same as the materials of the first spacer portion 93 and second portion 94 of the first conductive member 92. In this case, $T_3$ is equal to $T_1$ and $T_4$ is equal to $T_2$. This enables the source electrode 84 and the gate electrode 85 to be attached to the lead frame 86 in the same process and at the same temperature. The first spacer portion 97 may be provided by a ball bump which extends between the gate electrode 85 and the first surface 90 of the lead 88.

The second conductive member 95 has a smaller height than the height of the first conductive member 92 such that the gate electrode 85 is spaced at a distance $D_2$ from the upper surface 91 of the die pad 87. The distance $D_2$ is smaller than the distance $D_1$ between the source electrode 84 and the upper surface 91 of the die pad 87. The first side 83 of the transistor device 82 is arranged substantially parallel to the first surface 90 of the lead 88 and to the upper surface 91 of the die pad 87 and is substantially planar. The difference in the distance $D_2$ between the gate electrode 85 and the first surface 90 of the lead 88 and the distance $D_1$ between the source electrode 84 and the upper surface 91 of the die pad 87 is compensated by the differing sizes of the first conductive member 92 and the second conductive member 95.

The transistor device 82 is a vertical device and includes a drain electrode 99 on its upper second side 100 which faces away from the die pad 87. The drain electrode 99 is electrically coupled to one of the leads positioned adjacent the lead 88 by a contact clip 101 which is electrically coupled to the drain electrode 99 by, for example, a solder connection and to the lead by a further solder connection which is not seen in the cross-sectional view of FIG. 5.

The semiconductor package 80 further includes a housing 102 in the form of a mould compound, for example an epoxy resin. The epoxy resin covers the upper surface 91 and the side face 89 of the die pad 87, the transistor device 82, the first conductive member 92, the second conductive member 95, the contact clip 101 and the proximal end 96 of the leads. A lower surface 103 of the proximal end 96 of the leads is also embedded in the epoxy resin of the housing 102 such that the leads protrude from a first side face 104 of the housing 102 of the semiconductor package 80. The die pad 87 extends from an opposing side 105 of the housing 102 and provides a heat sink region 106 external to the housing 102. The heat sink region 106 may also include a through hole 107 with which the heat sink region 106 and the die pad 87 may be attached to a further component such as a portion of the circuit board or other support. A lower surface 108 of the die pad 87 is exposed from the epoxy resin.

Use of the first conductive member 92 enables the transistor device 82 to be mounted in a so-called source down arrangement within standard package outlines in which the first surface 90 of the leads is arranged in a different plane to the upper surface 91 of the die pad 87. The first conductive member 92 also spaces the first side 83 of the transistor device 82 and edges 109 formed between the first side 83 and side faces 110 of the transistor device 82 from the upper surface 91 of the die pad 87.

The lateral area of the first conductive member 92 may be selected such that the edges 109 are surrounded by the epoxy resin forming the housing 102 and are not in contact with the first conductive member 92. The second portion 94 of the first conductive member 92 may in a fluid state as the source electrode 84 is electrically coupled to the die pad 87. In this fluid state, the second portion 94 may conform to the outer surface of the first spacer portion 93 in order to define the lateral area of the first conductive member 92.

The lateral area of the first conductive member 92 may be defined by defining the lateral area of the first spacer portion 93 and second portion 94 and/or by selecting the quantity of the material forming the second portion 94. Similarly, the lateral area of the second conductive member 95 may be defined by defining the lateral area of the first spacer portion 97 and second portion 98 and/or by selecting the quantity of the material forming the second portion 98.

The gate electrode 85 typically has a smaller lateral area than the source electrode 84 so that a single second conductive member 95 may be provided whereas the plurality of first conductive members 92 may be provided.

Although one first conductive member 92 is illustrated in the cross-sectional view of FIG. 5, two or more first conductive members 92 may be provided which are spaced apart from one another. Each of the two or more first conductive members extends between the upper surface 91 of the die pad 87 and the source electrode 84.

The structure of the first conductive member 92 and/or the second conductive member 95 may differ from that illustrated in FIG. 5. For example, the first spacer portion 93 may be provided by a bond wire loop or a wedge bump in place of the ball bump. Similarly, the first spacer portion 97 of the second conductive member 95 may include a wedge bump or a bond wire loop in place of the ball bump.

Figure 6:
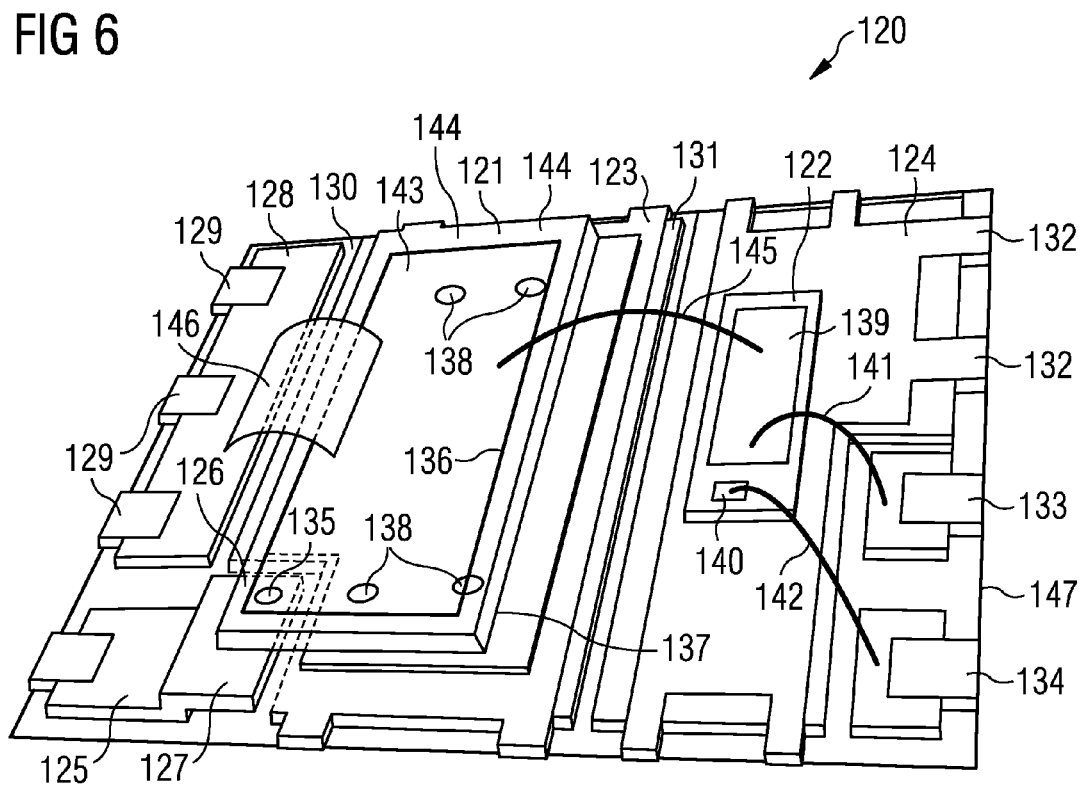
FIG. 6 illustrates a top perspective view of a semiconductor package according to a sixth embodiment.

FIG. 6 illustrates a top perspective view of a semiconductor package 120 including a first transistor device 121 and a second transistor device 122 in a half-bridge configuration. The semiconductor package 120 includes a first die pad 123 on which the first transistor device 121 is mounted and a second die pad 124 on which the second transistor device 122 is mounted. The second die pad 124 is arranged adjacent the first die pad 123 and is coplanar with the first die pad 123.

The semiconductor package 120 further includes an L shaped lead 125 providing a first gate contact terminal. The first die pad 123 includes a cutout in one corner and a leg of the lead 125 providing a proximal portion 127 is positioned in the cutout adjacent the first die pad 123. The proximal portion 127 of the lead 125 is bent slightly upwards and is positioned in a plane which is higher than the plane of the upper surface of the first die pad 123 and the upper surface of the second die pad 124.

The semiconductor package 120 further includes a lead frame portion 128 including three outer contacts 129 which is positioned adjacent the lead 125 on a first side 130 of the first die pad 123. The second die pad 124 is arranged adjacent an opposing side 131 of the first die pad 123 and has an L-shape including at least two outer contacts 132 positioned at the distal end of the L-shape. A further two leads 133, 134 are arranged adjacent the protruding portion of the second die pad 124 and are spaced at a distance from the second die pad 124 with the outer contacts 132. The leads 128, 133, 134 are substantially coplanar with the first die pad 123 and the second die pad 124.

The first transistor device 121 is mounted in a source down arrangement and has a gate electrode 126 arranged in a corner region which is mounted on the proximal portion 127 of the lead 125 by means of a conductive member 135. A source electrode 136 is also arranged on a lower side 137 of the first transistor device 121 and is mounted on and electrically coupled to the first die pad 123 by a plurality of conductive members 138. The conductive member 135 positioned between the gate electrode 126 and the proximal portion 127 of the lead 125 has a height which is less than the height of the conductive members 138 positioned between the source electrode 136 and the first die pad 123. The conductive members 138 enable the lower side 137 of the first transistor device 121 to be arranged at a distance from the upper surface of the first die pad 123.

The second transistor device 122 is mounted with a drain down orientation on the second die pad 124 so that the drain electrode of the second transistor device 122 is coupled to the second die pad 124. The outer contacts 132 of the second die pad 124 provide the $V_{in}$ terminal of the half-bridge configuration. The second transistor device 122 includes a source electrode 139 and a gate electrode 140 on its upper surface. The source electrode 139 is electrically coupled to the lead 133 by a bond wire 141 and to provide a source sensing function. The gate electrode 140 is electrically coupled to the lead 134 by a bond wire 142. The lead 134 therefore provides the second gate terminal of the semiconductor package 120.

A drain electrode 143 of the first transistor device 121 arranged on an upper surface 144 is electrically coupled to the source electrode 139 of the second transistor device 122 by a conductive member 145 which may be one or more bond wires or a contact clip. The semiconductor package 120 further includes a conductive member 146 extending between the drain electrode 143 of the first transistor device 121 and the lead frame portion 128. The lead frame portion 128 provides an output terminal $V_{out}$ for the half-bridge configuration. The conductive member 145 may be provided by one or more bond wires or by a contact clip, for example.

The semiconductor package 120 further includes a housing 147 covering the upper side of the leads 125, 128, 133, 134 and the upper side of the first die pad 123 and of the second die pad 124, the first transistor device 121 and the second transistor device 122 as well as the various bond wires. The housing may be formed from a mold compound such as an epoxy resin and may also electrically isolate the leads 125, 128, 133, 134 and the die pads 123, 124 from one another.

The lower side 137 of the first transistor device 121 is arranged at a distance from the upper surface of the first die pad 123. Edges formed between the lower side 137 and the side faces of the first transistor device 121 are arranged at a distance from the upper surface of the first die pad 123 and are embedded in the housing 147.

The source-down arrangement of the first transistor device 121 may assist in reducing the parasitic inductance of the source connection which, in turn, may assist in improving the switching efficiency. The distance between the first transistor device 121 and the first die pad 123 may be selected to assist in achieving a desired avalanche voltage.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures.

Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor packaging arrangement, comprising:
a transistor device comprising a first side, the first side comprising a source electrode and a gate electrode;
a die pad comprising a first surface, and
a lead comprising a first surface,
wherein a first conductive member is arranged between the source electrode and the first surface of the die pad and spaces the source electrode from the first surface of the die pad by a distance that is greater than a distance between the gate electrode and the first surface of the lead.

2. The arrangement according to claim 1, wherein the gate electrode is arranged on the first surface of the lead.

3. The arrangement according to claim 1, wherein the source electrode is electrically coupled to the die pad by the first conductive member.

4. The arrangement according to claim 1, wherein the first surface of the lead is arranged in a different plane from the first surface of the die pad.

5. The arrangement according to claim 1, wherein the lead is formed such that a portion of the first surface of the lead positioned adjacent the die pad is arranged in a different plane from the first surface of the die pad.

6. The arrangement according to claim 1, further comprising a second conductive member arranged between the gate electrode and the first surface of the lead.

7. The arrangement according to claim 1, further comprising a plurality of first conductive members arranged between the source electrode and the first surface of the die pad.

8. The arrangement according to claim 1, wherein the first conductive member comprises a first portion comprising a first melting point and a second portion comprising a second melting point that is lower than the first melting point.

9. The arrangement according to claim 8, wherein the first portion is substantially covered by the second portion.

10. The arrangement according to claim 8, wherein the first portion comprises at least one of the group consisting of: a ball bump, a wedge bump and a bond wire loop.

11. The arrangement according to claim 8, wherein the second portion comprises at least one of solder and electrically conductive adhesive.

12. The arrangement according to claim 11, wherein the second portion comprises solder that conforms to the outer contour of the first portion such that the solder is spaced from an edge formed between the first side and at least one side face of the transistor device.

13. The arrangement according to claim 8, further comprising intermetallic phases arranged between the first portion and the second portion.

14. The arrangement according to claim 9, wherein edges of the transistor device formed between the first side and side faces of the transistor device are spaced at a distance from the second portion.

15. A semiconductor package comprising:
a die pad comprising a first surface;
at least two leads, and
one or more transistor devices comprising a first side comprising a source electrode and a gate electrode and a second side opposing the first side, the second side comprising a drain electrode,
wherein a first conductive member is arranged between and spaces the source electrode from the first surface of the die pad by a distance that is greater than a distance between the gate electrode and the first surface of the lead.

16. The semiconductor package according to claim 15, wherein a gap between an end of the lead proximal to the die pad and the die pad within the semiconductor package is less than a distance between portions of the lead and the die pad at an outer surface of the semiconductor package.

17. The semiconductor package according to claim 15, wherein the drain electrode is electrically coupled to at least one of the leads.

18. The semiconductor package according to claim 15, wherein an edge of the transistor device formed between the first side and at least one side face of the transistor device is spaced at a distance from the first conductive member.

19. The semiconductor package according to claim 15, further comprising a second die pad and a second transistor device comprising a first side comprising a source electrode and a gate electrode and a second side opposing the first side, the second side comprising a drain electrode, wherein the drain electrode is arranged on the second die pad.

20. The semiconductor package according to claim 19, wherein the first transistor device and the second transistor device are configured in a half-bridge arrangement.

* * * * *